United States Patent
Schillaci et al.

(10) Patent No.: US 6,933,563 B2
(45) Date of Patent: Aug. 23, 2005

(54) HIGH PERFORMANCE, INTEGRATED, MOS-TYPE SEMICONDUCTOR DEVICE AND RELATED MANUFACTURING PROCESS

(75) Inventors: Antonino Schillaci, Messina (IT); Paola Ponzio, Catania (IT)

(73) Assignee: STMicroelectronics S.R.L. (IT)

( * ) Notice: Subject to any disclaimer, the term of this patent is extended or adjusted under 35 U.S.C. 154(b) by 0 days.

(21) Appl. No.: 10/677,108

(22) Filed: Sep. 30, 2003

(65) Prior Publication Data

US 2004/0094806 A1 May 20, 2004

(30) Foreign Application Priority Data

Oct. 9, 2002 (EP) .......................................... 02425611

(51) Int. Cl.⁷ ......................................... H01L 257/343
(52) U.S. Cl. ........................ 257/343; 257/341; 257/401
(58) Field of Search ............................... 257/341, 343, 257/335–337, E21, 418, E23.015, E29.027, E29.066, E29.136, E29.257, 401, 249, 275, E29.12, E29.134, E29.268

(56) References Cited

U.S. PATENT DOCUMENTS

| | | | |
|---|---|---|---|
| 5,521,409 A | * | 5/1996 | Hshieh et al. ............... 257/341 |
| 5,589,405 A | | 12/1996 | Contiero et al. |
| 5,744,843 A | * | 4/1998 | Efland et al. ............... 257/369 |
| 5,767,578 A | | 6/1998 | Chang et al. |
| 5,852,318 A | * | 12/1998 | Chikamatsu et al. ....... 257/390 |
| 5,898,198 A | | 4/1999 | Herbert et al. |
| 5,973,341 A | | 10/1999 | Letavic et al. |
| 6,020,617 A | | 2/2000 | Jos |
| 6,084,277 A | | 7/2000 | Disney et al. |
| 6,169,309 B1 | * | 1/2001 | Teggatz et al. ............. 257/328 |
| 6,297,533 B1 | * | 10/2001 | Mkhitarian ................. 257/336 |
| 6,313,512 B1 | * | 11/2001 | Schmitz et al. ............. 257/401 |
| 6,555,883 B1 | * | 4/2003 | Disney et al. .............. 257/401 |
| 6,677,210 B1 | * | 1/2004 | Hebert ....................... 438/301 |
| 6,825,536 B2 | * | 11/2004 | Disney et al. .............. 257/401 |
| 6,831,332 B2 | * | 12/2004 | D'Anna et al. ............. 257/343 |

FOREIGN PATENT DOCUMENTS

WO WO 02/073701 * 9/2002 ........... H01L/29/78

* cited by examiner

*Primary Examiner*—Long Pham
*Assistant Examiner*—Thao X. Le
(74) *Attorney, Agent, or Firm*—Carol W. Burton, Esq.; William J. Kubida, Esq.; Hogan & Hartson L.L.P.

(57) ABSTRACT

An LDMOS device includes elementary MOS cells. The gate structure of the elementary cell includes a first conductor material finger. The LDMOS device includes first metal stripes for contacting source regions, second metal stripes for contacting drain regions, and third metal stripes placed on inactive zones for contacting a material finger by forming a contact point. The contact point is formed by a first prolongation of the material finger for connecting with one of the third stripes. The third metal stripe includes at least one fourth metal stripe placed on a separation zone. The material finger has a second prolongation and the fourth metal stripe has a first prolongation to form an additional contact point.

20 Claims, 6 Drawing Sheets

US 6,933,563 B2

HIGH PERFORMANCE, INTEGRATED, MOS-TYPE SEMICONDUCTOR DEVICE AND RELATED MANUFACTURING PROCESS

A. FIELD OF THE INVENTION

The present invention refers to a high performance semiconductor integrated device of the metal oxide semiconductor (MOS) type, particularly to a lateral diffusion MOS (LDMOS) device and to related manufacturing processes.

B. BACKGROUND OF THE INVENTION

Actually there is a higher and higher evolution in the field of the radio frequency devices used in communication appliances as, for example, amplifiers in output stages of cellular transmitters. The research of higher and higher performances of said radio frequency devices and of maximum compatibly thereof with the other components of the different radio frequency appliances, it has brought to the use of different technologies for forming these devices as the LDMOS technology.

The LDMOS semiconductor devices have better features than those of the MOS semiconductor devices at high frequency, that is between 500 Mhz and 2 Ghz, because they allow a better setting of the input signal and a diminution of the losses of part of the output power for mismatch.

However a correct design of the input structure and of all the layout of the semiconductor device is necessary to minimize further losses. The input structure is mainly constituted by the gate terminal of the LDMOS device.

In each elementary cell belonging to the LDMOS device the electric connection of the single gate terminals is obtained by means of a single contact point. Therefore, each gate terminal called commonly "gate finger", may be constituted, for a concentrate parameter circuit, by a network RC wherein the resistor R is given by the resistor of the gate finger, formed generally in polysilicon, and the capacity C is essentially given by the capacity between the gate terminal and the source terminal of each single elementary cell. The propagation of a signal through the gate finger may therefore have a delay given by the value of the time constant RC.

Actually a technology for controlling the resistance of the gate finger consists of placing on the polysilicon of the gate finger a thin layer of high conductivity material as, for example, cobalt or tungsten silicide. Other technologies used provide LDMOS structures having two or three metallization levels in order to define more contact points without decreasing excessively the capacity component.

Normally the elementary cells belonging to a LDMOS device are placed in separated blocks and at a prefixed distance from each other. This is due to the fact that the arrangement and number thereof can increase the electromagnetic iteration thereof, thus causing a decreasing of the output power. This phenomenon, known even as "Power Combining effect", depends just on the distance between the blocks and on the number of the blocks.

SUMMARY OF THE INVENTION

In view of the state of the art described, it is an object of the present invention to provide a high performance semiconductor integrated device of the MOS type which allows to minimize the aforementioned disadvantages.

According to present invention, such object is obtained by means of a semiconductor integrated device of the MOS type comprising a substrate of a first conductivity type, said substrate comprising a plurality of active zones and inactive zones of said semiconductor device, said active zones comprising elementary MOS cells of said semiconductor device which are alternated to a plurality of separation zones, each one of said elementary MOS cells comprising at least one source region, at least one drain region and at least one gate structure, said at least one gate structure comprising at least one first conductor material finger, said device comprising first metal stripes adapted for contacting said source regions of the active zones, second metal stripes adapted for contacting the drain regions and third metal stripes placed on the inactive zones and adapted for contacting said at least one conductor material finger of each elementary cell by forming a contact point formed by a first prolongation of said at least one finger for connecting with one of said third stripes, said first metal stripes, said second metal stripes and said third metal stripes being placed on the substrate of semiconductor material substantially at the same level, characterized in that at least one of said third metal stripes comprises at least one fourth metal stripe placed on one of said separation zones, at least one conductor material finger of each elementary cell having at least one second prolongation and said at least one fourth metal stripe having at least one first prolongation adapted for being placed on said at least one second prolongation of said at least one material conductor finger to form at least another contact point.

Also according to present invention it is possible to provide a process for manufacturing of an integrated device of the MOS type.

Thanks to present invention it is possible to form a semiconductor integrated device of the MOS type which, even if it has only one metallization level, allows to form more contact points for the gate fingers. Also said integrated device has a structure that minimizes the electromagnetic iterations among the blocks of elementary cells of which it is composed.

BRIEF DESCRIPTION OF THE DRAWINGS

The features and the advantages of the present invention will be made evident by the following detailed description of embodiments thereof, shown as not limiting examples in the annexed drawings, wherein.

DETAILED DESCRIPTION

Figure 1:
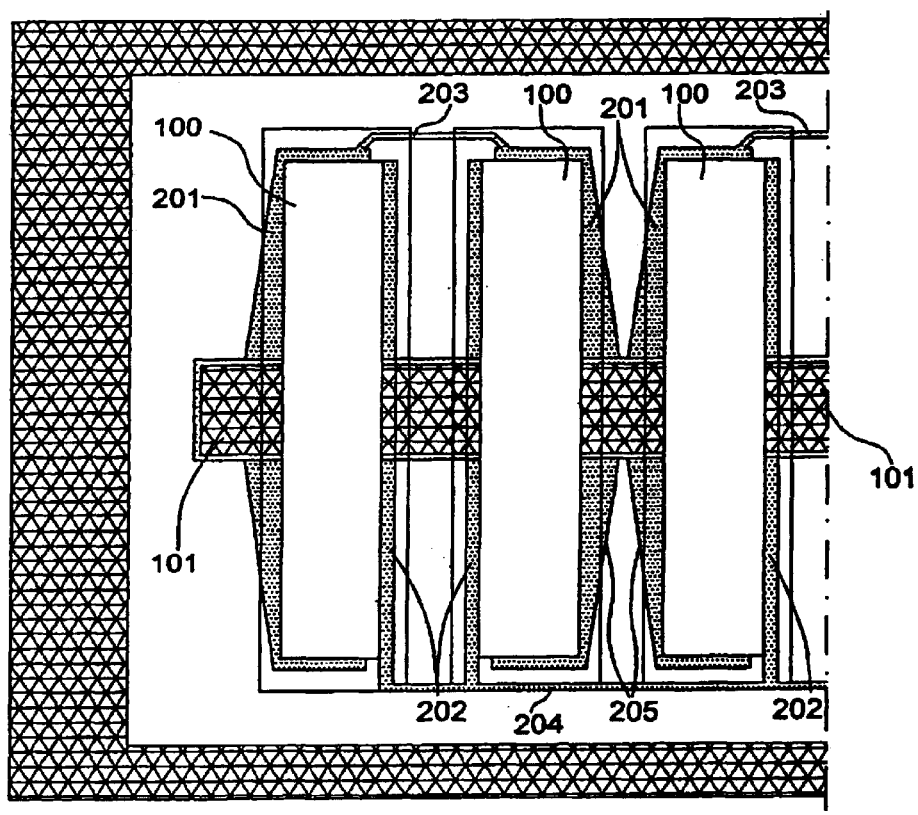
FIG. 1 is a schematic view of a part of a layout of a LDMOS device according to prior art.

In FIG. 1 a schematic view of a part of a layout of a LDMOS device according to prior art is shown. The blocks 100 constituting the active zones of the LDMOS device and which comprise single LDMOS elementary cells (wherein it is meant by elementary cells the structures formed by a source region, a drain region and a gate structure, that is, in such case, a structure composed by means of one thin oxide layer and one polysilicon finger) are separated and are at a prefixed distance from each other for controlling the Power Combining effect and the pads 101 are placed at the middle of the layout among the different blocks 100. For each block 100 the metal stripes 201 and 202 are shown which are adapted for contacting respectively the drain terminals and the gate terminals of the single LDMOS elementary cells of each block 100 and which are placed on inactive zones of said device. The stripes of each block 100 are connected with each other by means of arc-shaped elements 203 or by means of extensions 205 of the stripes 201 while the stripes 202 are connected with each other by means of elements 204.

Figure 2:
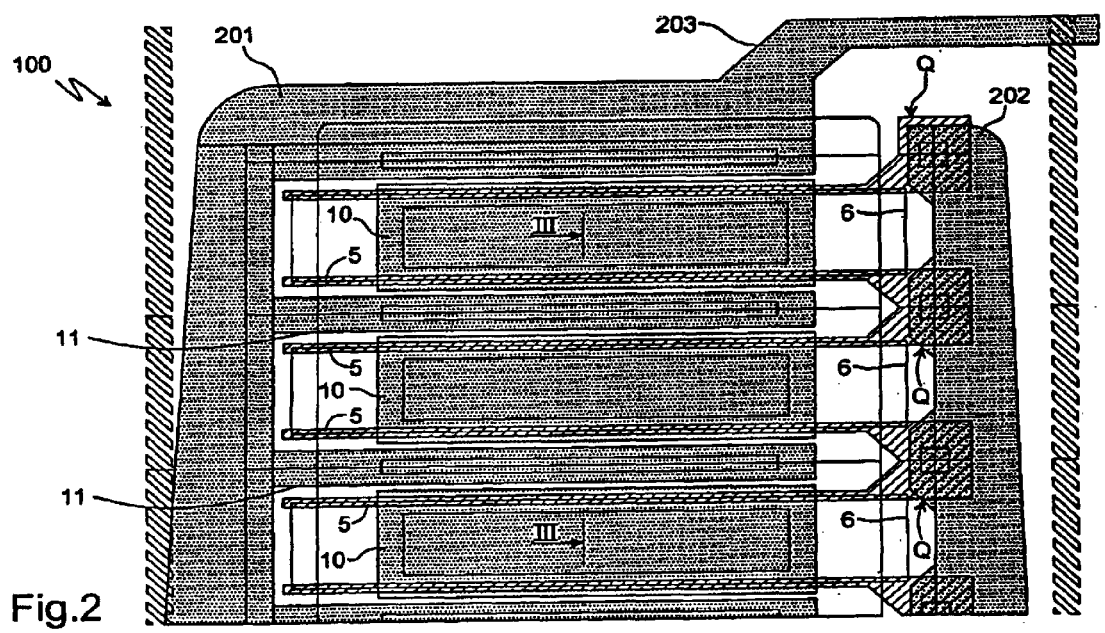
FIG. 2 is a more detailed view of a zone of the layout in FIG. 1.

In FIG. 2 a zone of a block 100 of the layout in FIG. 1 is shown in more detail. The LDMOS device under examination is a device with a single metal layer wherein the polysilicon gate fingers of the single elementary cells forming each block 100 are contacted at a single point Q by the metal stripe 202 adapted for connecting said gates to bring the driving signals.

Figure 3:
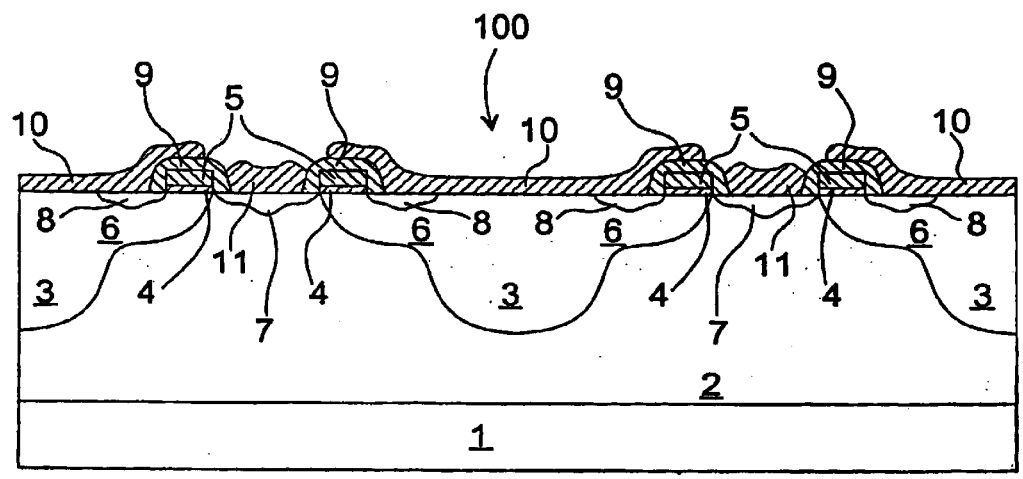
FIG. 3 shows a section of the device in FIG. 2 according to line III—III.

In FIG. 3 a section of the device in FIG. 2 according to line III—III is shown. An epitaxial layer 2 of P type with low dopant concentration is formed on a substrate 1 of P type with high dopant concentration. After a first step of oxidizing and a step of masking followed by a successive etch step for forming windows, it occurs an implant of P type dopant at high concentration, for example boron, which is made to diffuse for forming sinker regions 3. In successive steps it occurs the deposition of gate oxide 4, the deposition of polysilicon layers 5 over the gate oxide layers 4, and the successive doping of the polysilicon. The successive steps of the process for manufacturing the LDMOS device provide the steps for forming the body regions 6 with a P type dopant, which have a central part with high dopant concentration of P type, the implants for forming drain regions 7 and source regions 8 with N type dopant, the formation of intermediate passivant layers 9 over and about the gate oxide layers 4 and the polysilicon layers 5, the deposition of a metal layer for forming metal stripes 10 for contacting the source regions 8, metal stripes 11 and metal stripes 201 for contacting the drain regions 7 and metal stripes 202 for contacting the gate fingers 5. In FIGS. 2 and 3 it is shown that for any two polysilicon layers 5 one single contact point Q with the metal stripe 202 is formed and the metal stripes 11 are interdigitated and connected with the metal stripe 201. The stripes 10, 11, 201 and 202 are at the same level, therefore the device in FIGS. 1–3 is a single metallization level device.

Figure 5:
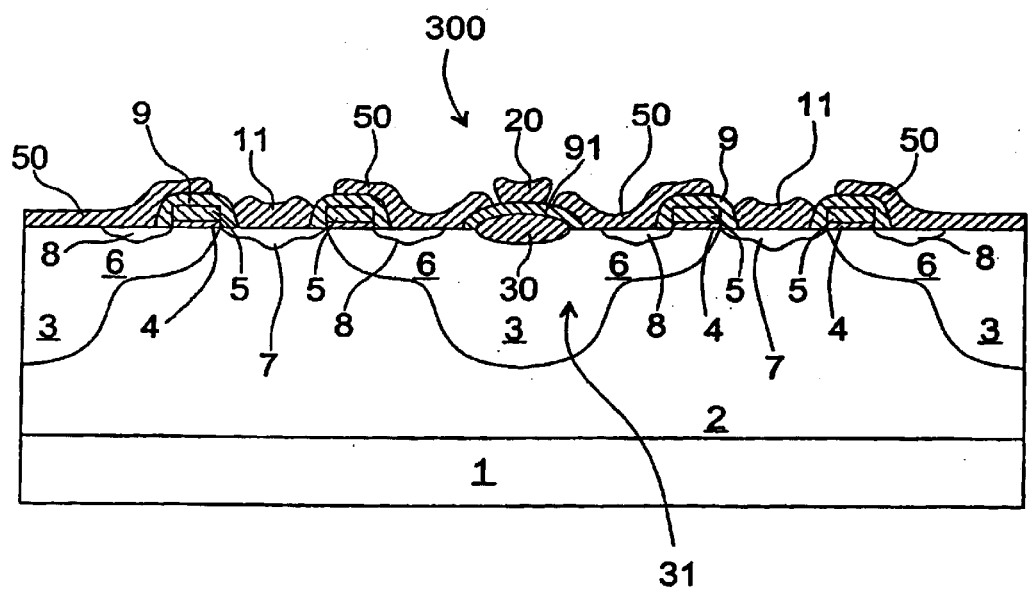
FIG. 5 shows a section of the device in FIG. 4 according to line V—V.
Figure 4:
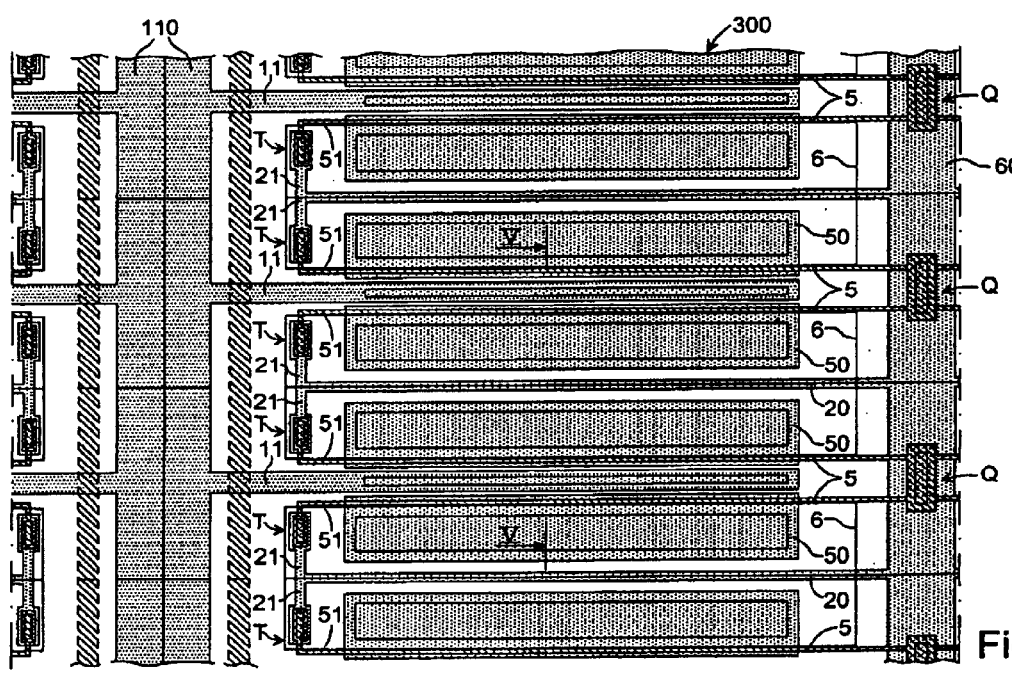
FIG. 4 is a schematic view of a part of a layout of a LDMOS device according to a first embodiment of the present invention.

In FIGS. 4 and 5 a device according to a first embodiment of the present invention is shown; the elements equal to those of the section in FIG. 3 will be represented by the same numeric references. The device according to a first embodiment of the invention provides the presence of blocks 300 of active zones of the device and of inactive zones. In each block 300 an epitaxial layer 2 of P type with low dopant concentration is formed on a substrate 1 of P type with high dopant concentration. After a first step of oxidizing and a step of masking followed by a successive etch step for forming windows, it occurs an implant of P type dopant at high concentration, for example boron, which is made to diffuse for forming sinker regions 3. In successive steps it occurs the deposition of gate oxide 4, the deposition of polysilicon layers or fingers 5 over the gate oxide layers 4, and the successive doping of the polysilicon. The successive steps of the process for manufacturing the LDMOS device provide the steps for forming the body regions 6 with a P type dopant, which have a central part with high dopant concentration of P type, the implants for forming drain regions 7 and source regions 8 with N type dopant.

In the layout in FIG. 4 it is possible to ascertain that three contact points between two gate fingers and the metal stripe 60 which is necessary to contact them. This is due to the formation of metal stripes 20 that derive from a main metal stripe 60, or metal bus 60, and allow increasing the contact points between the metal bus 60 and the polysilicon layers or fingers 5. In fact prolongations 21 derive from the stripes 20 which are placed over prolongations 51 of each gate finger 5 to form other contact points T placed on the body regions 6. Said stripes 20 are formed in separation zones 31 of the active zones 300; said separation zones 31 are alternated to couples of LDMOS elementary cells in each block 300.

In fact the process for manufacturing the LDMOS device comprises a step for forming field oxide regions 30, called even LOCOS, over the sinker region 3. In such step a first step for depositing field oxide and a second step of thermal diffusion so that said field oxide is diffused inside the body regions 6 occur. In a successive step the formation of intermediate passivant layers 9 over and about the gate oxide layers 4 and the polysilicon layers 5, which are the gates of the elementary cells composing the LDMOS device, and the formation of intermediate passivant layers 91 over the LOCOS regions 30 occur.

In a successive step the deposition of a metal layer for forming the metal stripes 50 adapted for contacting the source regions 8, the metal stripes 11 and metal stripes 110 which are adapted for contacting the drain regions 7 and the metal stripes 60 and 20 occur. The metal stripes 50 differently from the metal stripes 10 in FIG. 3 are interrupted in the central portion over the LOCOS regions 30 and the intermediate passivant layers 91, along the body stripes 6; in such way the metal stripes 20 may be deposited over the intermediate passivant layers 91 which allow to increase the contact points between the metal bus 60 and the polysilicon layers 5. Each separation zone 31 is given therefore by a portion of body region 6 arranged between the source regions 8 placed in the same body region 6. The stripes 20 are formed in a transversal direction with respect to the formation of the channel in the elementary cells forming the LDMOS device while the prolongations 21 and 51 are formed in a parallel direction with respect to the formation of the channel in said LDMOS elementary cells. Also the metal stripes 20 are parallel to the metal stripes 11 deriving from the main metal stripe 110. The stripes 20, 50, 11, 110 and 60 are at the same level, therefore the device in FIGS. 4 and 5 is a single metallization level device.

The resistance R of the gate finger is decreased by means of the presence of the contact points T because two contact points occur for each gate finger; the diminution of the resistance causes a decreasing of the time constant RC and therefore a diminution of the propagation delay of the electric signals.

Figure 6:
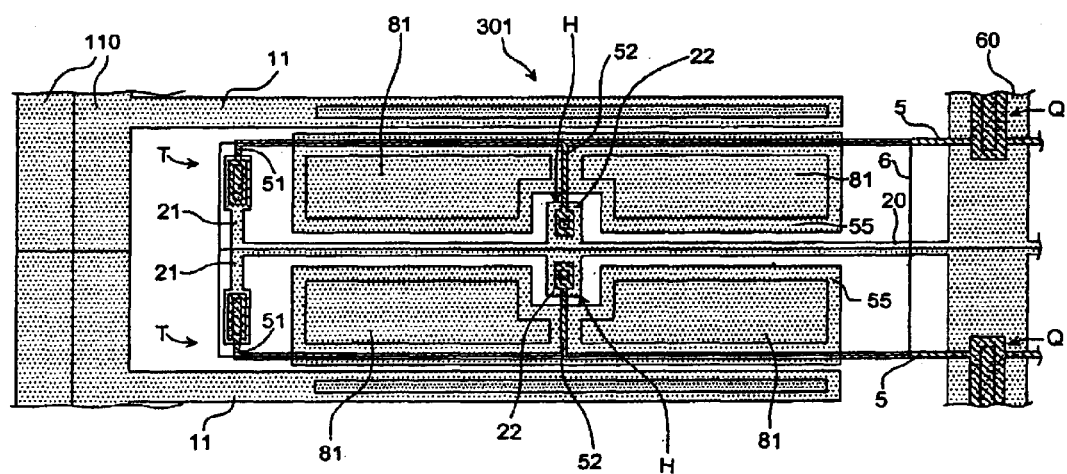
FIG. 6 is a schematic view of a part of a layout of a LDMOS device according to a second embodiment of the present invention.

In FIG. 6 a device according to a second embodiment of the present invention is shown; in the layout it is possible to ascertain that there are three contact points between one gate finger and the metal bus that is necessary to contact it instead of two contact points of the first embodiment. This is due to the formation of a further contact point between the metal stripes 20 and the polysilicon fingers 5, that is a new contact point H placed on the body region 6 which is formed by superimposing further prolongations 22 of the stripes 20 over further prolongations 52 of the polysilicon fingers 5. The contact point H is formed near the central part of the body region 6 and near the central part of the stripes 20 and of the fingers 5. This is obtained by means of a different mask for forming metal stripes 55 adapted for contacting said source regions 3. In fact the metal stripes 55 show in a central part a smaller width than the stripes 50 in FIG. 4 for the formation of said further contact point H. The mask for forming the contacts 81 shows a smaller width in the central part and an interruption in presence of the prolongations 52 of the polysilicon fingers 5. The prolongations 52 and 22 have a direction parallel to the formation of the channel of the elementary cells of the LDMOS device. The further contact point H allows a decrease in the resistance R that causes a diminution of the time constant RC and therefore a further diminution of the propagation delay of the electric signals. The stripes 55, 11, 110, 60 and 20 are at the same level, therefore the device in FIG. 6 is a single metallization level device.

Figure 7:
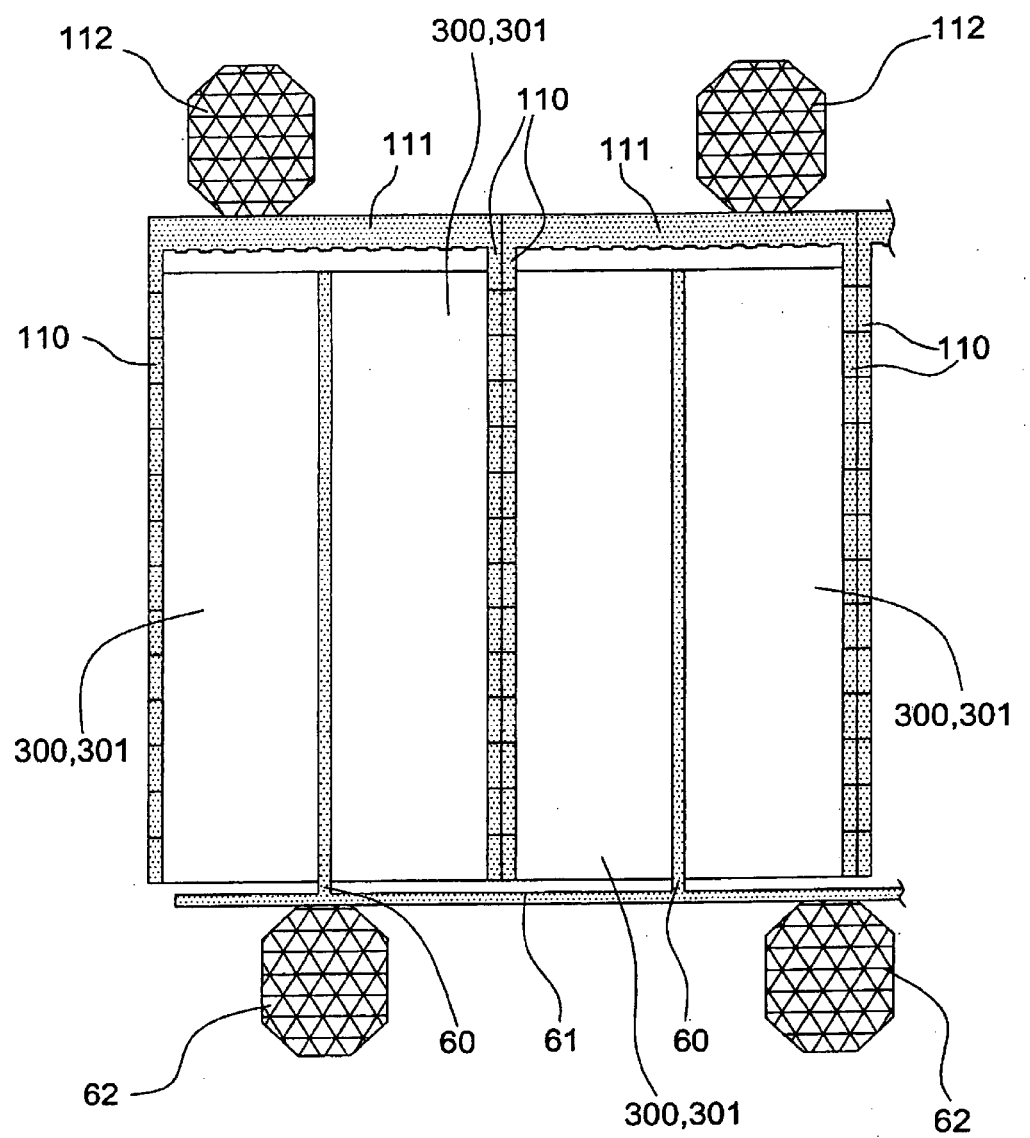
FIG. 7 is a schematic view of a part of the layout of the device according to invention.

In FIG. 7 the layout of the device according to the first or the second embodiment of the present invention is shown. The blocks 300 or 301 formed by the elementary cells composing the LDMOS device and by the separation zones 31 are contiguous to each other minimising the Power Recombining effects because any connection does not exist which may form a mismatch between the adjacent blocks 300 or 301. More precisely the couples of adjacent blocks 300 or 301 are separated from each other by means of a couple of stripes 110 adjacent to each other. The couples of metal stripes 110 of each couple of blocks 300 or 301, which as previously said serve for contacting the drain regions of the device, are added to the couple of adjacent stripes 110 or to the single adjacent metal stripe 110 by means of transversal stripes 111 placed on the top of the chip wherein the device is formed as shown in FIG. 7. The transversal stripes 111 are connected with pads 112 used for outputting or introducing electric signals in the device.

Each couple of adjacent blocks 300 or 301 shows a metal stripe 60 adapted for contacting the gate fingers of the cells and it is placed between the blocks 300 or 301 forming said couple and in parallel to the stripes 110. Therefore each single metal stripe 60 allows contacting the gate fingers of each elementary cell of the blocks 300 or 301 belonging to the couple. Also, as shown in FIGS. 4 and 6, each contact point Q allows contacting contemporaneously four polysilicon fingers 5 with the metal stripe 60.

The couples of metal stripes 60 of each couple of blocks 300 or 301 are added to the adjacent stripes 60 by means of transversal stripes 61 placed on the bottom of the chip wherein the device is formed as shown in FIG. 7. The transversal stripes 61 are connected with pads 62 used for outputting or introducing electric signals in the device. Therefore the arrangement of the transversal stripes 111 and 61 in the periphery of the chip but in opposite periphery parts of the chip and the consequent arrangement of the pads 112 and 62 in the periphery of the chip and about the series of the blocks 300 or 301, allow to form easily the welding of the wires between the chip and the capacitors of the adaptation network.

What is claimed is:

1. A metal oxide semiconductor (MOS) integrated device comprising:
   a substrate of a first conductivity type, said substrate including a plurality of active zones and inactive zones, said active zones including elementary MOS cells alternating with a plurality of separation zones, each one of said elementary MOS cells including at least one source region, at least one drain region and at least one gate structure, said at least one gate structure including at least one first conductor material finger;
   first metal stripes for contacting said source regions of the active zones;
   second metal stripes for contacting the drain regions; and
   third metal stripes placed on the inactive zones and for contacting said at least one conductor material finger of each elementary cell by forming a contact point formed by a first prolongation of said at least one finger for connecting with one of said third stripes, said first metal stripes, said second metal stripes and said third metal stripes being placed on the substrate substantially at the same level,
   wherein at least one of said third metal stripes includes at least one fourth metal stripe placed on one of said separation zones, at least one conductor material finger of each elementary cell having at least one second prolongation and said at least one fourth metal stripe having at least one first prolongation for being placed on said at least one second prolongation of said at least one material conductor finger to form at least another contact point.

2. The device according to claim 1, wherein each separation zone of said plurality of separation zones is alternated to a couple of elementary MOS cells in each active zone.

3. The device according to claim 2, wherein said second metal stripes comprise at least one further metal stripe, said at least one fourth metal stripe being parallel to said at least one further metal stripe and being placed between two of said first stripes.

4. The device according to claim 3, wherein said semiconductor device comprises a lateral diffusion MOS (LDMOS) device and said elementary MOS cells comprises LDMOS cells, and said substrate comprises an epitaxial layer of the first conductivity type that comprises a plurality of sinker regions of the first type of conductivity and a body region of the first type of conductivity, each body region being placed on each sinker region and includes two of said source regions of said elementary LDMOS cells, each one of said plurality of separation zones being constituted by the portion of the body region between the source regions.

5. The device according to claim 4, wherein said at least one fourth metal stripe extends in a transversally with respect to the formation of the channel of each elementary LDMOS cell.

6. The device according to claim 5, wherein said at least a first prolongation of said at least a fourth stripe and said at least a second prolongation of the conductor material finger extend in a direction parallel to the direction of the channel in each elementary LDMOS cell.

7. The device according to claim 4, further comprising a field oxide layer placed in said one separation zone, said at least a fourth metal stripes being superimposed on said field oxide layer.

8. The device according to claim 7, further comprising a passivant layer placed between said field oxide layer and said at least a fourth metal stripe.

9. The device according to claim 8, wherein said at least one first prolongation of said at least a fourth stripe and said at least a second prolongation of the conductor material finger are placed on body regions of said semiconductor device.

10. The device according to claim 9, further comprising a second prolongation of said at least a fourth stripe and a further prolongation of the conductor material finger which are placed together in said active zones of the device.

11. The device according to claim 1, wherein said conductor material finger comprises a polysilicon finger.

12. The device according to claim 1, wherein said at least a fourth metal stripe comprises a plurality of fourth metal stripes placed respectively on each one of said separation zone plurality.

13. The device according to claim 12, wherein each one of said third metal stripes comprises said plurality of fourth metal stripes.

14. The device according to claim 1, wherein the active zones of said plurality of active zones of the device are placed adjacent to each other.

15. The device according to claim 14, wherein said second metal stripes further comprise main metal stripes parallel to each other and placed parallel to the formation of the channel of the elementary MOS cells, said main stripes being placed in inactive zones of the device and each couple of adjacent active zones being placed between two of said further main metal stripes.

16. The device according to claim 15, wherein at least one of the further main metal stripes of a couple of active zones is integral with the further metal stripes of the adjacent couple of active zones.

17. The device according to claim 16, further comprising first elements for connecting two further main stripes of each couple of active zones, said first elements being placed on peripheral parts of the chip wherein the device is formed and being associated with first pads for introducing or outputting electric signals.

18. The device according to claim 17, wherein said third metal stripes are parallel to each other and to said further metal stripes and wherein each couple of adjacent active zones comprises one of said second metal stripes that is placed between said two active zones of the couple.

19. The device according to claim 18, further comprising second elements for connecting two third stripes of adjacent couples of active zones, said second elements being placed on peripheral parts of the chip wherein the device is formed and being associated with second pads for introducing or outputting electric signals.

20. The device according to claim 19, wherein said first elements and said first pads are placed in the peripheral part of the chip which opposite to the peripheral part of the chip wherein said second elements and said second pads are placed.

* * * * *